United States Patent [19]
Ashida

[11] Patent Number: 6,069,818
[45] Date of Patent: May 30, 2000

[54] SEMICONDUCTOR MEMORY DEVICE HAVING STORAGE NODES DOPED WITH FIRST AND SECOND TYPE IMPURITIES

[75] Inventor: Motoi Ashida, Tokyo, Japan

[73] Assignee: Mitsubishi Denki Kabushiki Kaisha, Tokyo, Japan

[21] Appl. No.: 09/069,206

[22] Filed: Apr. 29, 1998

[30] Foreign Application Priority Data

Sep. 18, 1997 [JP] Japan ................................. 9-253247

[51] Int. Cl.[7] ........................................................ G11C 11/24
[52] U.S. Cl. ............................................ 365/149; 365/182
[58] Field of Search ................................. 365/149, 182; 257/306, 311, 904; 437/41, 52

[56] References Cited

U.S. PATENT DOCUMENTS 5,250,832  10/1993  Murai ........................................ 257/306
5,323,343   6/1994  Ogoh et al. ............................... 365/149
5,716,862   2/1998  Ahmad et al. ............................ 437/41

FOREIGN PATENT DOCUMENTS 61-241967  10/1986  Japan .
5-3300      1/1993  Japan .

Primary Examiner—David Nelms
Assistant Examiner—David Lam
Attorney, Agent, or Firm—McDermott, Will & Emery

[57] ABSTRACT

A first impurity is implanted into source-drain regions of a first type of MOS transistor, a second impurity is implanted into source-drain regions of a second type of MOS transistor, and both first and second impurities are implanted into data storage nodes, whereby a double-layer structure is formed. The source-drain regions of the respective MOS transistors are further doped with another kind of impurity. Thus, a semiconductor memory device is provided which is free of depletion layer induced leak currents, the depletion layer being restrained to extend to the substrate surface by the impurity profile of the data storage nodes.

6 Claims, 6 Drawing Sheets

<n-/p Junction leak characteristics>

<Impurity Profile and Depletion Layer>

<No Bias Voltage>

< Memory cell portion >

< Peripheral circuit portion >

FIG. 4

Comparison of Device Performance

| Device Performance <4MSRAM> | Specification | Conventional product | | | Improved product | | |
|---|---|---|---|---|---|---|---|
| | | High temperature | Room temperature | Low temperature | High temperature | Room temperature | Low temperature |
| Input voltage VIH | 2.2V min. | 2.03V | 2.12V | 2.13V | 2.04V | 2.12V | 2.13V |
| Input voltage VIL | 0.8V max. | 1.33V | 1.35V | 1.35V | 1.32V | 1.35V | 1.35V |
| Output voltage VOH | 2.4V min. | 4.31V | 4.32V | 4.33V | 4.31V | 4.32V | 4.33V |
| Output voltage VOL | 0.4V max. | 0.13V | 0.11V | 0.10V | 0.12V | 0.11V | 0.10V |
| Input leak current | 1.0uA max. | <0.01uA | <0.01uA | <0.01uA | <0.01uA | <0.01uA | <0.01uA |
| Output leak current | 1.0uA max. | <0.01uA | <0.01uA | <0.01uA | <0.01uA | <0.01uA | <0.01uA |
| Supply Current ICC1 | 70mA max. | 47.9mA | 51.1mA | 52.3mA | 46.2mA | 50.3mA | 51.5mA |
| Supply Current ICC3 | 20uA max. | 7.54uA | 0.48uA | 0.08uA | 3.22uA | 0.31uA | 0.04uA |
| Supply Current ICC5 | 0.4uA max. (@3V) | | 0.22uA | | | 0.08uA | |
| Access 1a(A) | 55ns max. | 41.7ns | 35.7ns | 31.1ns | 40.8ns | 36.2ns | 30.9ns |
| Operating higher limit voltage | 5.5V max. | 7.5V | 7.5V | 7.5V | 7.5V | 7.5V | 7.5V |
| Operating lower limit voltage | 3.0V max. | 2.8V | 2.84V | 2.89V | 2.4V | 2.45V | 2.49V |
| Data holding lower limit | 2.0V max. | 0.94V | 0.83V | 0.78V | 0.72V | 0.61V | 0.55V |

<n−/p Junction leak characteristics>

<Impurity Profile and Depletion Layer>

<No Bias Voltage>

<3V bias voltage>

SEMICONDUCTOR MEMORY DEVICE HAVING STORAGE NODES DOPED WITH FIRST AND SECOND TYPE IMPURITIES

BACKGROUND OF THE INVENTION

1. Field of the Invention

The present invention relates to a semiconductor memory and a method of fabrication thereof. More particularly, the invention relates to improvements of data storage nodes in a semiconductor memory.

2. Background Art

FIGS. 5A through 5D illustrate the structure and operation of a conventional semiconductor memory device. FIG. 5A is a cross-sectional view of a semiconductor memory device. In FIG. 5A, Q1 and Q2 indicate MOS transistors and ND represents a data storage node. In this semiconductor memory device, a P-type well 2 on a silicon substrate 1 is isolated by a field isolation oxide film 3. On the surface of the film 3 are a gate oxide film 4, a gate electrode 5 and a gate side wall 6.

A source-drain region SD1 of the MOS transistor Q1 comprises an N− region 7 and an N+ region 9. A source-drain region SD2 of the MOS transistor Q2 includes an N− region 8 and an N+ region 9. The data storage node ND has an N− region 8 forming an N−/P junction with the P-type well 2. The N− region 8 of the MOS transistor Q2 and the N− region 8 of the data storage node ND are formed at the same time and have the same impurity profile.

FIGS. 6A through 6C illustrate how the conventional semiconductor memory device of FIG. 5A is fabricated. As shown in FIG. 6A, the field isolation oxide film 3 is first formed over the P-type well 2 of the silicon substrate 1. The gate oxide film 4 and gate electrode 5 are then formed in regions where the MOS transistors Q1 and Q2 are to be fabricated. The regions of the MOS transistor Q2 and data storage node ND are covered with a resist 11a. Phosphorus (P) ions are implanted into the region of the MOS transistor Q1 to form the N− region 7.

As shown in FIG. 6B, the region of the MOS transistor Q1 is covered with a resist 11b. Arsenic (As) ions are implanted into the region of the MOS transistor Q2 and into the region of the data storage node ND to form the N− regions 8 for those respective components. Then, as illustrated in FIG. 6C, the side wall 6 is formed for the gate electrode 5. The region of the data storage node ND is covered with a resist 11c. Arsenic (As) ions are implanted into the regions of the MOS transistors Q1 and Q2 to form the N+ regions 9 for those respective components. The N+ regions 9 are formed deep in the substrate through high-level energy injection and by implantation of high-density arsenic ions. The semiconductor memory device shown in FIG. 5A is fabricated by the above process.

In a conventional semiconductor memory device having the structure outlined above, PN junctions in the data storage node ND and other portions of the device having the same potential level [as shown in FIG. 6B] are formed at the same time as the N− region 8 of the nearby N-channel MOS transistor Q2 and implanted with the same type of ions.

Thus, the densities and profile of the impurities in the N− region 8 are determined predominantly by the performance of the MOS transistor Q2. This poses a problem in that the performance of the N− region 8 is not necessarily adequate when used for data storage node ND. Specifically, its PN junction characteristics tend to include a leak current component.

FIGS. 5B and 5C are cross sectional views showing typical densities and profiles of P- and N-type impurities in the PN junction of the data storage node ND of FIG. 5A as well as depletion layers associated therewith. FIG. 5B illustrates a depletion layer in effect when no bias voltage is applied, and FIG. 5C indicates a deletion layer in effect when a bias voltage of 3 V is applied. Because the densities and profiles of P- and N-type impurities in the PN junction are insufficient, bias voltages higher than a certain level (2.5 V in this example) cause the depletion layer to extend to the substrate surface and to provide a leak path, as shown in FIG. 5C. This leads to generation of a leak current component in the PN junction characteristics as shown graphically in FIG. 5D. The leak current can increase up to about ten times the magnitude of its normal state.

SUMMARY OF THE INVENTION

It is therefore an object of the present invention to overcome the above and other deficiencies of the prior art and to provide a semiconductor memory that suppresses leak currents in data storage nodes.

It is another object of the present invention to provide a semiconductor memory capable of suppressing leak currents in the data storage nodes and a method of fabrication thereof, which method comprises varying the profile and densities of impurities in data storage nodes without increasing the number of masks or ion implantation steps in its fabrication.

It is a further object of the present invention to provide a semiconductor memory such as an SRAM with improved performance characteristics.

According to one aspect of the present invention, a semiconductor memory device is provided comprising a plurality of first-type MOS transistors having source-drain regions doped with a first kind of impurity, and a plurality of second-type MOS transistors having source-drain regions doped with a second kind of impurity. Further provided are a plurality of data storage nodes doped with said first and said second kinds of impurities.

In another aspect of the present invention, said first and said second impurities are distributed at different depths.

In another aspect of the present invention., the source-drain regions of said first and said second-type of MOS transistors are doped with a third kind of impurity.

In another aspect of the present invention, said third kind of impurity is distributed more deeply than said first and said second kind of impurities.

In another aspect of the present invention, said first-type of MOS transistors, said second-type of MOS transistors and said data storage nodes are formed in a P-type region of a silicon semiconductor substrate, and said first kind of impurity is phosphorus and said second kind of impurity is arsenic.

In another aspect of the present: invention, the semiconductor memory device further comprises a memory cell portion and a peripheral circuit portion, and said memory cell portion includes said first-type of MOS transistors and said data storage nodes, and said peripheral circuit portion includes said secondtype of MOS transistors.

According to another aspect of the present invention, in a method of fabricating a semiconductor memory device, a first kind of impurity is implanted into source-drain sub-regions of the regions of a first-type of MOS transistor and into data storage node regions in a predetermined area of a semiconductor substrate. A second kind of impurity is implanted into source-drain sub-regions of the regions of a second-type of MOS transistor and into said data storage node regions in said predetermined area of said semiconductor substrate. Further, a third kind of impurity is implanted into the source-drain sub-regions of the regions of said first-type of MOS transistor and into those of said second-type of MOS transistor more deeply than in said steps of implanting said first and said second kind of impurities. The source-drain regions for the respective MOS transistors are thereby formed.

In another aspect of the present invention, in a method of fabricating a semiconductor memory device, a semiconductor substrate is divided into a memory cell portion and a peripheral circuit portion. The first type of MOS transistors and said data storage nodes are formed in said memory cell portion, and said second type of MOS transistors are formed in said peripheral circuit portion.

In another aspect of the present invention, in a method of fabricating a semiconductor memory device, said predetermined area of said semiconductor substrate is a P-type region of a silicon semiconductor substrate, and said first kind of impurity is phosphorus and said second kind of impurity is arsenic.

Other and further objects, features and advantages of the invention will appear more fully from the following description.

BRIEF DESCRIPTION OF THE DRAWINGS

FIG. 4 is a table comparing the performance of a conventional SRAM and the SRAM of the third embodiment of the present invention.

DESCRIPTION OF THE INVENTION

Figure 1:
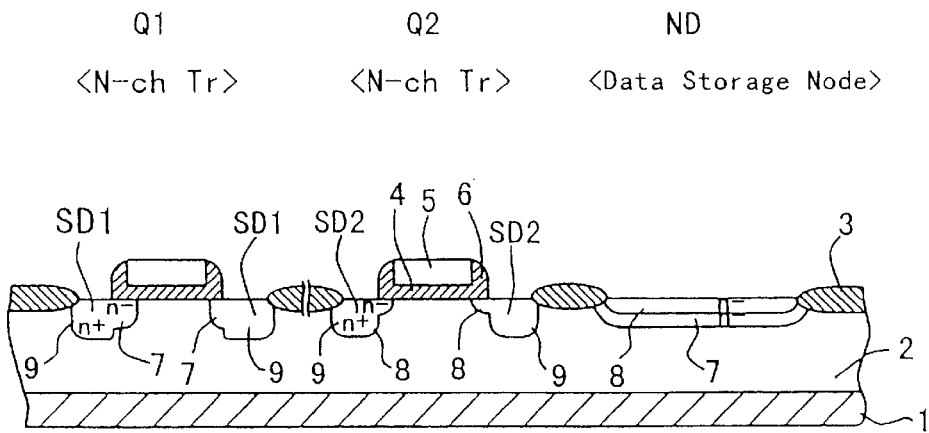
FIGS. 1A through 1D schematically illustrate the structure and graphically illustrate operation of a semiconductor memory device in accordance with a first embodiment of the present invention.

Preferred embodiments of the invention will now be described with reference to the accompanying drawings in which like reference characters designate like or corresponding parts.
First Embodiment FIGS. 1A through 1D illustrate the structure and operation of a semiconductor memory device in accordance with a first embodiment of the present invention. The first embodiment comprises two kinds of N-channel MOS transistors whose N− regions are formed using a plurality of different kinds of ions. FIG. 1A is a cross-sectional view of the inventive semiconductor memory. In FIG. 1A, Q1 denotes a first type MOS transistor, Q2 denotes a second type MOS transistor, and ND indicates a data storage node. Reference numeral 1 denotes a silicon substrate, 2 denotes a P-type well, 3 denotes a field isolation oxide film, 4 denotes a gate oxide film, 5 denotes a gate electrode, and 6 denotes a gate side wall.

Also in FIG. 1A, reference numeral 7 denotes an N− region implanted with a first impurity (phosphorus ions in this example) in the source-drain region SD1 of the first type MOS transistor Q1, as well as in the data storage node ND; 8 is an N− region implanted with a second impurity (arsenic ions in this example) in the source-drain region SD2 of the second type MOS transistor Q2 as well as in the data storage node ND; and 9 is an N+ region implanted with a third impurity (arsenic ions in this example) in the source-drain regions SD1 and SD2 of the first and second type MOS transistors Q1 and Q2.

The N− region 7 of the MOS transistor Q1 and the N− region 7 of the data storage node ND are formed concurrently through implantation of suitable first impurities such as phosphorus ions and have the same impurity profile. The N− region 8 of the MOS transistor Q2 and the N− region 8 of the data storage node ND are formed concurrently through implantation of suitable second impurities such as arsenic ions and have the same impurity profile. Furthermore, the N+ regions 9 of the MOS transistors Q1 and Q2 are formed concurrently through implantation of suitable third impurities such as arsenic ions and have the same impurity profile. The N+ region 9 is formed with arsenic ions implanted at a higher level of energy so that the region 9 will be formed more deeply and with a higher density than the N− regions 7 and 8. In the data storage node ND, the N− region 7 is formed more deeply than the N− region 8, thus constituting a double-layer structure.

In the first embodiment of the invention, the N− region of the data storage node is formed of a plurality of layers containing different kinds of impurities, thus creating an N−/P junction. Therefore, when the bias voltage for normal use is applied, a depletion layer made up of the N−/P junction falls short of the substrate surface, drastically reducing the leak current component of the N−/P junction.

Figure 1D:
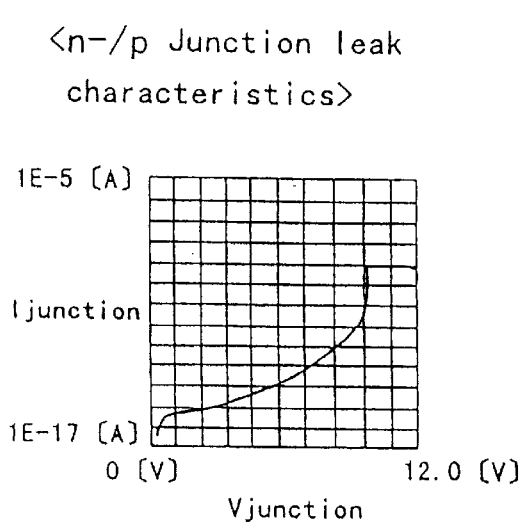
Figure 1:
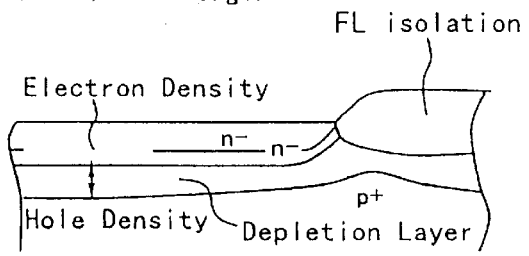
Figure 1:
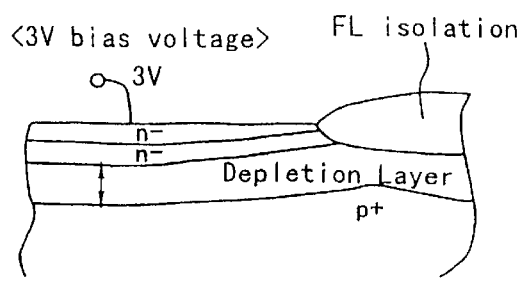

FIGS. 1B and 1C illustrate how the impurities of the data storage node are profiled and how depletion layers are formed in association therewith. FIG. 1B shows a depletion layer in effect when no bias voltage is applied, and FIG. 1C depicts a deletion layer in effect when a bias voltage of 3 V is applied. With the bias voltage applied, the depletion layer of the data storage node does not reach the surface as illustrated in FIG. 1C. FIG. 1D is a graphic representation of an N−/P junction leak characteristic regarding the data storage node ND, showing than the leak current of the memory device of the first embodiment is about one-fiftieth of the leak current of a conventional device.

Figure 2A:
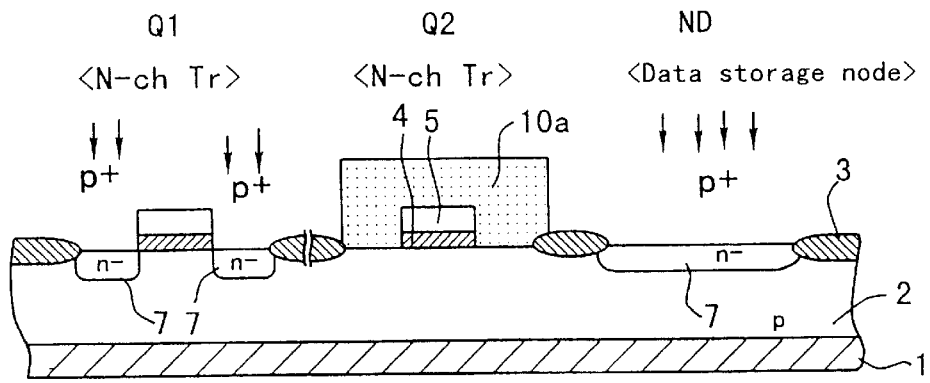
FIGS. 2A through 2C schematically illustrate sequential phases of a method in accordance with the present invention.
Figure 2B:
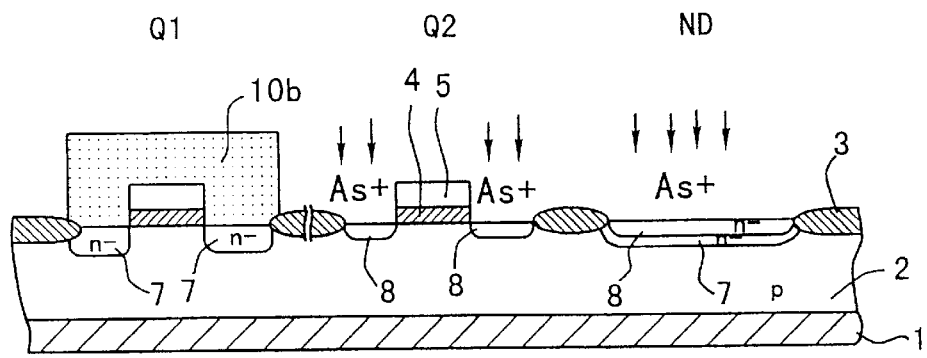
Figure 2C:
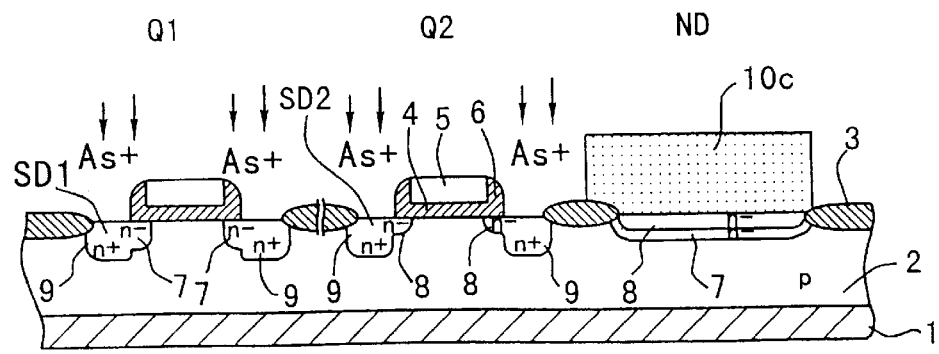

Thus, the first embodiment of the present invention provides a semiconductor memory and a method for fabrication thereof whereby the impurities of the data storage node are appropriately profiled and the leak current is suppressed.
Second Embodiment FIGS. 2A through 2C show key steps of a method for fabricating a semiconductor memory device according to a second embodiment of the present invention. As shown in FIG. 2A, a field isolation oxide film 3 is first formed over a P-type well 2 of a silicon substrate 1. A gate oxide film 4 and a gate electrode 5 are then formed in regions where MOS transistors Q1 and Q2 are to be fabricated. These steps are similar to those of conventional methods of memory device fabrication.

The region of the MOS transistor Q2 is covered with a resist mask 10a. Phosphorus (P) ions are implanted as first impurities to form a source-drain region of the MOS transistor Q1 (a first-type MOS transistor) as well as into the region of a data storage node ND, whereby N− regions 7 are formed for those respective components.

As depicted in FIG. 2B, the region of the MOS transistor Q1 is then covered with a resist mask lob. Arsenic (As) ions are implanted as second impurities to form a source-drain region of the MOS transistor Q2 (second-type MOS transistor) as well as into the region of the data storage node ND, whereby N– regions 8 are formed for these respective components. In the data storage node ND, the N– region 8 is more shallow than the region N– region 7.

Gate side walls 6 of the MOS transistors Q1 and Q2 are formed as illustrated in FIG. 2C. Thereafter, the region of the data storage node ND is covered with a resist mask 10c. Arsenic (As) ions are implanted as third impurities to form the source-drain regions of the MOS transistors Q1 and Q2, forming N+ regions 9 for those respective components. Arsenic ions of a higher density are implanted more deeply in the N+ regions 9 than in other regions by application of a higher level of energy. In this manner, the source-drain region SD1 of the MOS transistor Q1 is formed with the N– region 7 and N+ region 9, and the source-drain region SD2 of the MOS transistor Q2 comprises of the N– region 8 and N+ region 9. The processes above thus fabricate the semiconductor memory whose structure is shown in FIG. 1A.

Figure 6A:
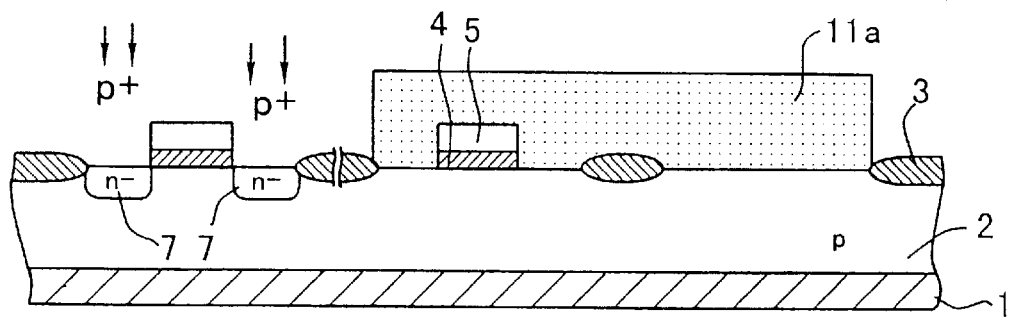
FIGS. 6A through 6C schematically illustrate sequential phases of a conventional method for fabricating a semiconductor memory device.
Figure 6B:
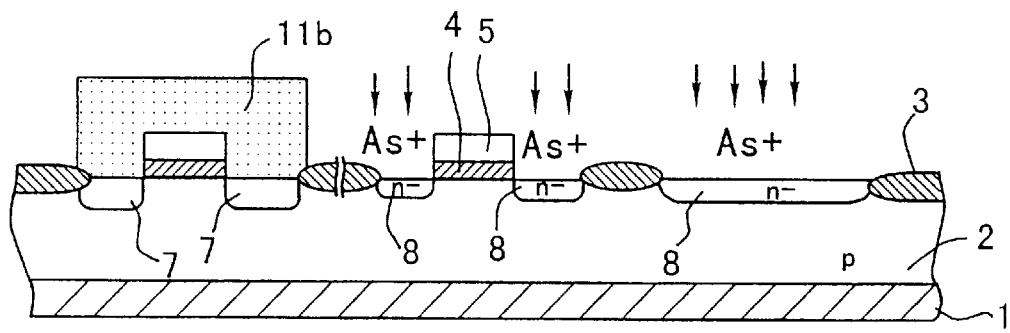
Figure 6C:
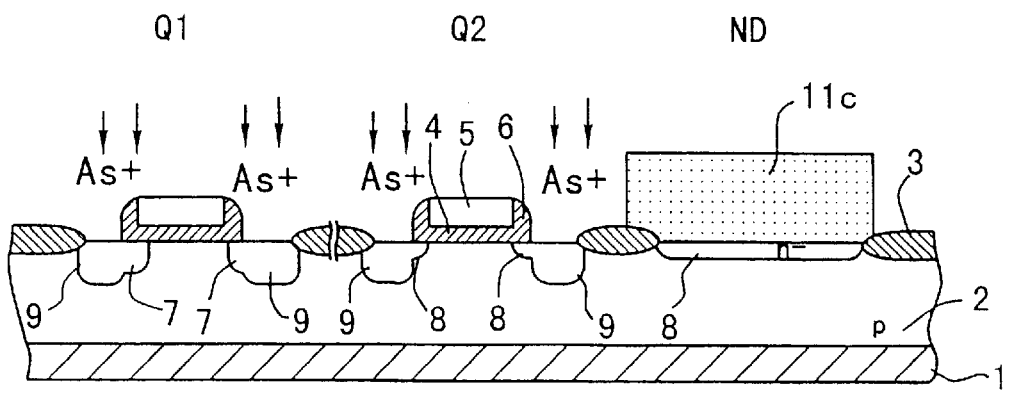

With the inventive method above, ion implantation is carried out three times to form the source-drain regions SD1 and SD2 of the MOS transistors Q1 and Q2, as well as the impurity region of the data storage node ND. Hence, three resist masks 10a, 10b and 10c are provided through which to inject ions. The number of ion implantation steps and the number of resist masks required by the inventive method are the same as those required by the conventional method illustrated in FIGS. 6A through 6C. That is, the method of the second embodiment of the invention only requires changing resist mask pattern settings to establish an appropriate impurity profile for the inventive semiconductor memory, with no increase in the conventional number of ion implantation steps or resist masks.

Figure 3A:
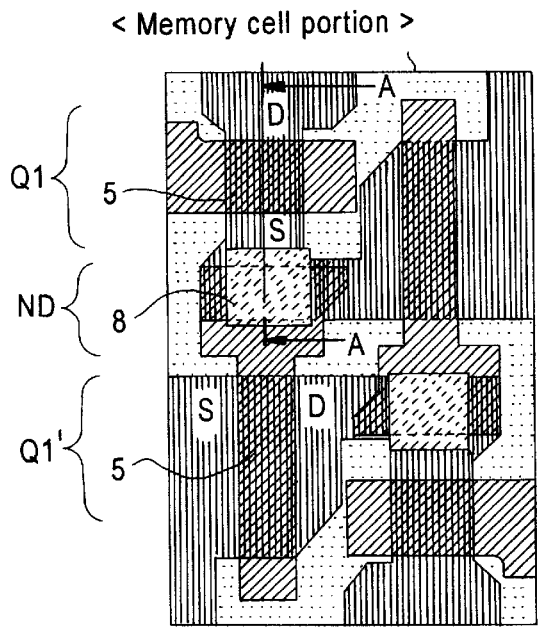
FIGS. 3A through 3C schematically illustrate the structure of a semiconductor memory device (SRAM) in accordance with a third embodiment of the present invention.
Figure 3B:
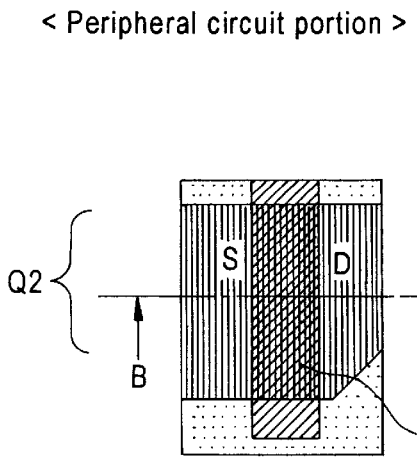
Figure 3C:
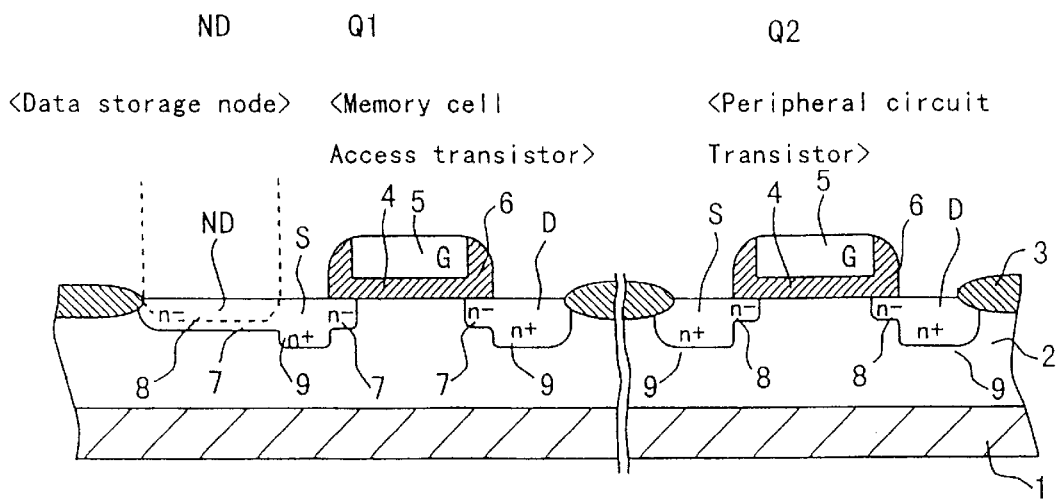
Figure 5A:
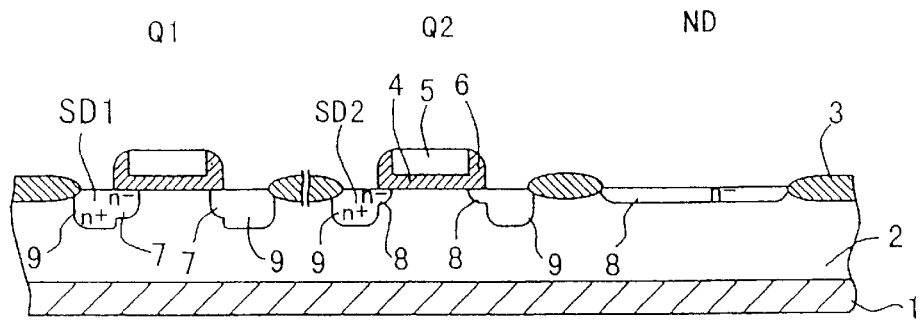
FIGS. 5A through 5D schematically illustrate the structure and graphically illustrate operation of a conventional semiconductor memory device.
Figure 5D:
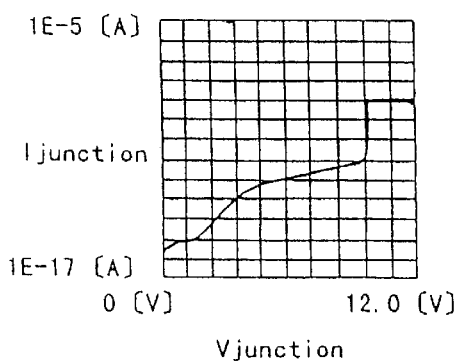
Figure 5B:
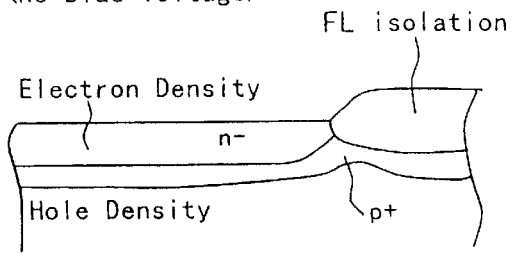
Figure 5C:
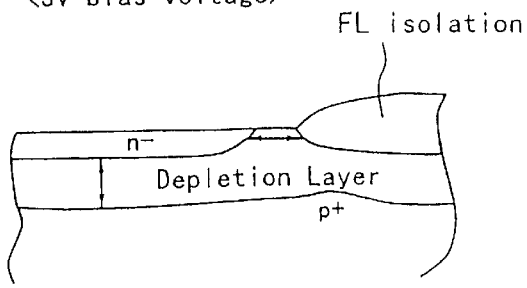

In the method of the second embodiment of the invention, as described, different kinds of ions are implanted into a memory device to form N– regions therein a plurality of times, and different kinds of ions are implanted into the data storage node of the device to form the N– region therein, thus forming the N–/P junction. In establishing the impurity profile for the N– region, only the mask openings for ion implantation need to be changed. There is no need to change the conventional number of resist masks or ion implantation steps. The second embodiment provides a semiconductor memory suppressing leak currents in the N–/P junction of its data storage nodes, as well as a method of fabricating that memory Third Embodiment As an example of a semiconductor device using the N–/P junction in its data storage nodes as disclosed in the first and the second embodiments of the invention, an SRAM will now be described as a third embodiment of the invention FIGS. 3A through 3C depict the structure of a semiconductor memory device (SRAM) according to the third embodiment of the invention. FIG. 3A is a partial plan view of a memory cell portion of the SRAM, and FIG. 3B is a partial plan view of a peripheral circuit portion of the SRAM. The left-hand portion of FIG. 3C is a cross-sectional view taken on line A—A in the memory cell portion, and the right-hand portion of FIG. 3C is a cross-sectional view taken on line B—B in the peripheral circuit portion.

In FIGS. 3A–3C, Q1 represents an access MOS transistor in the memory cell portion, Q1' denotes a driver MOS transistor, ND denotes a data storage node, and Q2 indicates a MOS transistor in the peripheral circuit portion. A source-drain region SD1 of the access MOS transistor Q1 is connected with the data storage node ND inside the memory cell portion. The remaining aspects of the structure are the same as those in FIGS. 1A through 1C and will not be described further In view of its potential applications, the SRAM must satisfy two requirements: low power dissipation and low voltage operation. There are three parameters representing these requirements: (A) data holding lower limit voltage, (B) operating Vcc lower limit voltage, and (C) standby dissipation current at data hold time. In the device of third embodiment of the invention, different kinds of impurities are implanted into a plurality of layers to form N–regions, whereby an N–/P junction state is established. This enhances the Vcc lower limit voltage (thus meeting requirement B). With the N–/P junction leak current drastically reduced, it is possible to improve the characteristics of the data holding lower limit voltage and of the standby dissipation current at data hold time (thus satisfying requirements A and C).

FIG. 4 is a table comparing the performance of a conventional SRAM (listed as "Conventional Product") and the SRAM of the third embodiment (indicated as "Improved Product"). In FIG. 4, a characteristic called "Operating Lower Limit Voltage" corresponds to the Vcc lower limit voltage mentioned above, "Data Holding Lower Limit" to the data holding lower Limit voltage above, and "Supply Current" (ICC3 and ICC5) to the standby dissipation current at data hold time. As evident from FIG. 4, the inventive SRAM provides better device performance than its conventional counterpart. It should be noted that the SRAM whose structure is shown in FIGS. 3A through 3C may be fabricated by application of the method according to the second embodiment of the invention. The application of the method of the second embodiment in fabricating the memory device of the third embodiment will not be described further, to avoid repetition. The memory device of the third embodiment is fabricated in accordance with the method of the second embodiment with no increase in the conventional number of resist masks or ion implantation steps.

The SRAM device of the third embodiment simultaneously enhances major device performance characteristics, i.e., data holding lower limit voltage, Vcc lower limit voltage, and standby dissipation current at data hold time. Whereas the description above has centered on the SRAM, semiconductor memory devices include not only by SRAMs but also by DRAMs. In such devices, PN junctions are used to form the data storage nodes and their related portions of the same potential level. This invention is applicable extensively and advantageously to the formation of such PN junctions.

The effects and advantages of the present invention are summarized as follows.

As described and according to the present invention, data storage nodes of a semiconductor memory are fabricated by use of different kinds of impurities that are used in forming source-drain regions of first- and second-type MOS transistors therein. The inventive semiconductor memory thus structured has an impurity profile in its data storage node that reduces junction leak currents in the data storage nodes, thus improving the performance of the semiconductor memory.

A semiconductor memory according to the present invention has a memory cell portion and a peripheral circuit portion. The memory cell portion includes first-type MOS transistors and data storage nodes, and the peripheral circuit portion comprises secondtype MOS transistors. The data storage nodes are formed using different kinds of impurities.

The inventive semiconductor memory reduces junction leak currents in the data storage nodes, thereby improving performance.

Furthermore, a semiconductor memory fabricating method according to the present invention fabricates the inventive semiconductor memory by making improvements in the mask pattern and ion implantation pattern whereby first and second-type MOS transistors and data storage nodes are formed. There is no need to increase the conventional number of masks or ion implantation steps.

Many modifications and variations of the present invention are possible in the light of the above teachings. It should therefore be understood that, within the scope of the appended claims, the invention can by practiced otherwise than as specifically described.

What is claimed is:

1. A semiconductor memory device formed on a semiconductor substrate, said memory device comprising:

a plurality of first-type MOS transistors having source-drain regions thereof doped with a first impurity;

a plurality of second-type MOS transistors having source-drain regions thereof doped with a second impurity; and a plurality of data storage nodes doped with said first and said second type impurities.

2. The semiconductor memory device according to claim 1, wherein said first and said second impurities are distributed at different depths.

3. The semiconductor memory device according claim 1, wherein said first-type MOS transistors, said second-type MOS transistors and said data storage nodes are formed in a P-type region of a silicon semiconductor substrate, and wherein said first impurity is phosphorus and said second impurity is arsenic.

4. The semiconductor memory device according to claim 1, further comprising a memory cell portion and a peripheral circuit portion, said memory cell portion including said first-type MOS transistors and said data storage nodes, said peripheral circuit portion including said second-type MOS transistors.

5. A semiconductor memory device formed on a semiconductor substrate, said memory device comprising:

a plurality of first-type MOS trasistors having source-drain regions thereof doped with a first impurity;

a plurality of second-type MOS transistors having source-drain regions thereof doped with a second impurity; and a plurality of data storage nodes doped with said first and second impurities;

wherein the source drain regions of said first and second type MOS transistors are doped with a third impurity.

6. The semiconductor memory device according to claim 5, wherein said third impurity is distributed more deeply than said first and said second impurities.

* * * * *